(12) United States Patent
Sander et al.

(10) Patent No.: US 7,736,550 B2
(45) Date of Patent: Jun. 15, 2010

(54) METHOD OF MANUFACTURING AN OPTICAL DEVICE BY MEANS OF A REPLICATION METHOD

(75) Inventors: Aloysius Franciscus Maria Sander, Eindhoven (NL); Gerardus Maria Dohmen, Eindhoven (NL); Edwin Maria Wolterink, Eindhoven (NL)

(73) Assignee: Anteryon B.V. (NL)

( * ) Notice: Subject to any disclaimer, the term of this patent is extended or adjusted under 35 U.S.C. 154(b) by 1078 days.

(21) Appl. No.: 10/504,138

(22) PCT Filed: Jan. 27, 2003

(86) PCT No.: PCT/IB03/00240

§ 371 (c)(1),
(2), (4) Date: Aug. 10, 2004

(87) PCT Pub. No.: WO03/069741

PCT Pub. Date: Aug. 21, 2003

(65) Prior Publication Data
US 2005/0104238 A1    May 19, 2005

(30) Foreign Application Priority Data
Feb. 13, 2002   (EP) ................................. 02075588

(51) Int. Cl.
*B29D 11/00* (2006.01)

(52) U.S. Cl. .................................................. 264/1.32

(58) Field of Classification Search ................. 264/1.32
See application file for complete search history.

(56) References Cited

U.S. PATENT DOCUMENTS 5,178,800 A * 1/1993 Blum ........................ 264/1.38
5,986,818 A   11/1999 Hashimura
6,305,194 B1 * 10/2001 Budinski et al. .............. 65/105

FOREIGN PATENT DOCUMENTS

JP   8227002(A)   9/1996
JP   11008372(A)  1/1999

* cited by examiner

*Primary Examiner*—Steven P Griffin
*Assistant Examiner*—Queenie Dehghan
(74) *Attorney, Agent, or Firm*—Wood, Phillips, Katz, Clark & Mortimer

(57) ABSTRACT

The invention relates to a method and an apparatus for manufacturing an optical device by means of a replication method comprising the steps of: a) filling a gap between a substrate and a mold with a liquid light-transmissive polymeric material, b) curing the polymeric material to obtain a replica layer, c) removing the mold. In order to manufacture optical devices, such as lenses having a larger NA-value, it is proposed according to the present invention that the replication method is repeated at least two times while using the same or different molds, and that the substrate, together with one or more replica layers obtained during one or more previous runs of the replication method, is used as a substrate for the next run of the replication method.

7 Claims, 1 Drawing Sheet

METHOD OF MANUFACTURING AN OPTICAL DEVICE BY MEANS OF A REPLICATION METHOD

Figure 1:
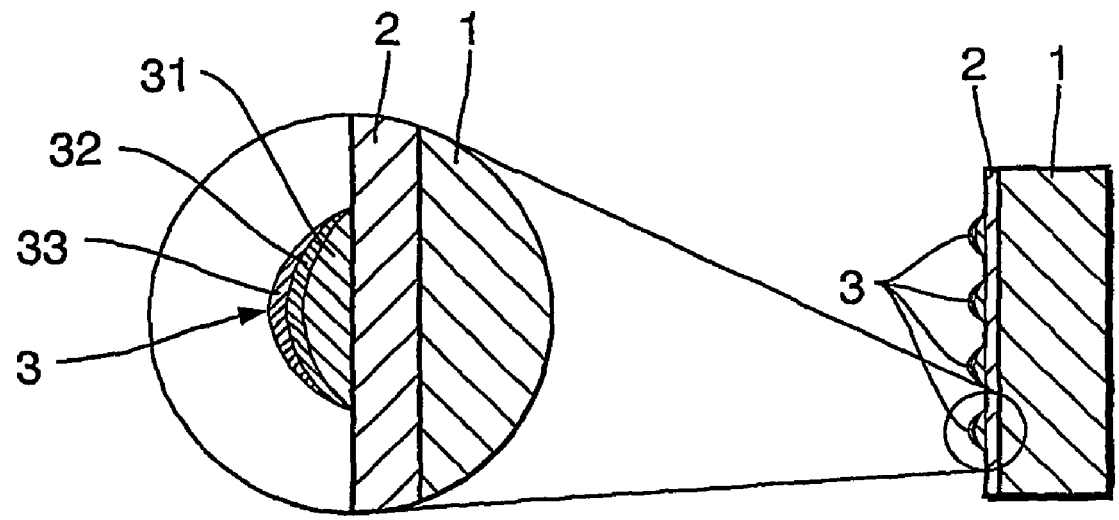

The invention relates to a method of manufacturing an optical device by means of a replication method comprising the steps of:

filling a gap between a substrate and a mould with a liquid light-transmissive polymeric material,
curing the polymeric material to obtain a replica layer,
removing the mould.

The invention also relates to an apparatus for manufacturing an optical device by means of a replication method as defined in claim 6 and to an optical device as defined in claim 7 manufactured by means of a method according to the invention.

Such a replication method and an apparatus for producing a lens having an accurately centered spherical surface are described in detail in U.S. Pat. No. 4,615,847 the disclosure of which is herein incorporated by reference. The replication technology is a well-known technology for manufacturing high-performance, diffraction-limited lenses. Both spheres and flat substrates, usually glass, are used as base components, on which a thin layer, preferably in the tens of microns range, of polymer, i.e. the "replica" is applied.

Often, flat substrates are preferred because of costs and convenience. This is especially correct in the case of lens arrays. However, a limitation of replication on flat substrates is the achievable numeric aperture (NA) of the lenses obtained. Within a single replication step, the maximum achievable NA is currently at most ca. 0.2. Larger NA-values lead to thicker replica layers with a larger thickness gradient, which will show an unacceptably large shape deformation of the replica layer after the replication due to undefined shrinkage.

It is therefore an object of the present invention to provide a method and an apparatus for manufacturing an optical device as well as such an optical device itself, having a higher NA-value.

According to the present invention, this is achieved by a method as defined in claim 1 wherein said replication method is repeated at least two times while using the same or different moulds, and wherein the substrate, together with one or more replication layers obtained during one or more previous runs of the replication method, is used as a substrate for the next run of the replication method. A corresponding manufacturing apparatus according to the invention as defined in claim 6 comprises control means for controlling the manufacturing process accordingly.

The invention is based on the idea of applying at least two, preferably several, relatively thin replica layers on top of the same substrate, i.e. each subsequent replica layer is formed on top of the replica layer obtained during the previous run of the replication method while the basic substrate is always the same. Thus, the achievable NA can be increased significantly up to a NA-value of ca. 0.5. Since each obtained replica layer acts as a base component for the next replication run, the occurring shape deformation per replica layer is much smaller than in the case of applying the total replica layer at once during one single run of the replication method.

Preferred embodiments of the invention are defined in the dependent claims. According to a first preferred embodiment, the moulds used during subsequent runs of the replication method are adapted in such a way that the replication layers obtained during said runs have different thicknesses and/or shapes.

According to another preferred embodiment, the substrate has a flat or a convex surface onto which the replica layers are replicated. The invention is preferably suitable for use with a flat surface, because the NA-value is limited with a single replication run. However, the substrate must not necessarily be flat, and all kinds of convex surfaces, i.e. spherical surfaces, are possible.

The invention can be applied in different fields for manufacturing an optical device. Preferred fields of application are lenses, in particular micro-lenses, collimator lenses or objective lenses, lens arrays, fibre collimators, optical switches, optical amplifiers, tunable laserdiode transmitters, and/or high-power pump lasers.

Figure 2:
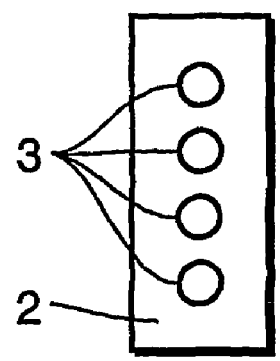

The invention will now be explained in more detail with reference to the drawings in which FIG. 1 is a side view of a lens array manufactured according to the present invention and FIG. 2 is a top view of such a lens array.

The lens array shown in FIG. 1 comprises a flat substrate 1 made of glass, a buffer replica layer 2 and a number of micro-lenses 3 on top of the buffer layer 2, which micro-lenses 3 are manufactured according to the present invention. On the left-hand side of FIG. 1, one of said micro-lenses 3 together with a portion of the buffer layer 2 and the substrate 1 is shown on an enlarged scale. As can easily be seen, the micro-lens 3 comprises three replica layers 31, 32, 33 which are manufactured during subsequent runs of the replication method. During a first run, replica layer 31 is directly replicated on top of the surface 20 of the buffer layer 2 which, together with the substrate 1, forms a kind of another "substrate" for the replication of the lens 3. The buffer layer 2 itself can also be manufactured by means of such a replication method.

After the first hardened, stable replica layer 31 has been replicated onto the buffer layer 2, a second replica layer 32 is manufactured during a second run of the replication method on top of the first replica layer 31 which, together with the buffer layer 2 and the substrate 1, forms the "substrate" for said second replica layer 32. In a third run of the replication method, a third replica layer 33 is subsequently manufactured on top of the second replica layer 32.

As can be seen, the thicknesses and the shapes of the replica layers 31, 32, 33 are different, which is achieved by using different kinds of moulds during manufacture of the layers. However, also the same moulds can be used, resulting in similar or identical replica layers. Regarding the replication method itself, reference is again made to U.S. Pat. No. 4,615,847 which is herein incorporated by reference. In this patent, the steps of the replication method are described in detail and a manufacturing apparatus using said replication method is described.

FIG. 2 is a top view of the lens array shown in FIG. 1 comprising four micro-lenses 3 on top of the buffer layer 2.

Typical parameter values of such a lens array are the height of the micro-lens 3 and the thickness of the buffer layer 2 are in the range from 50 to 200 μm. The thickness of the substrate 1 is in the range from 1 to 5 mm. The diameter of the micro-lens 3 ranges from 0.1 to 2 mm. The distance between micro-lenses is in the range from 0.01 to 5 mm. The length as well as the width of the whole array is from 1 to 10 mm. The refraction value of a replica layer is 1.57; the refraction value of the substrate is 1.517 (Bk7). However, it should be noted that these parameter values are only examples.

The number of replication runs will be different depending on the NA-value which is to be achieved. The materials to be used, preferably polymers and glass, may differ depending on the application and the resulting design involved. The number of lenses in the array or in a matrix may also differ depending on the application and the resulting design involved. In summary, semiconductor optical devices having a larger NA-value can be manufactured by means of the method according to the present invention, and the occurring shape deformation per replica layer is much smaller than in the case of applying only a single replica layer having a larger thickness.

The invention claimed is

1. A method of manufacturing an optical device by means of a replication method comprising the steps of: filling a gap between a glass substrate and a mould with a liquid light-transmissive polymeric material, curing the polymeric material to obtain a replica layer, removing the mould, wherein said replication method is repeated at least two times while using the same or different moulds, and wherein the substrate, together with one or more replica layers obtained during one or more previous runs of the replication method, is used as a substrate for the next run of the replication method, wherein, in a first run of the replication method, a flat replica layer forming a buffer layer is obtained on the substrate, wherein a height of said replica layers and a thickness of said buffer layer are in the range of 50 to 200 μm, wherein said method includes simultaneously manufacturing a plurality of said optical devices by means of said replication method, including forming said optical devices at a distance between the optical devices in a range from 0.01 to 5 mm, with each said optical device having a diameter of at least 0.1 mm.

2. A method as claimed in claim 1, wherein the moulds used during subsequent runs of the replication method are adapted in such a way that the replica layers obtained during said runs have different thicknesses and/or shapes.

3. A method as claimed in claim 1, wherein said substrate has a flat or a convex surface onto which the replica layers are replicated.

4. A method as claimed in claim 1, said method being used for manufacturing lenses, including micro-lenses, collimator or objective lenses, lens arrays, fibre collimators, optical switches, optical amplifiers, tunable laserdiode transmitters, and/or lasers.

5. A method as claimed in claim 1, wherein each optical device has a NA value of at least 0.2.

6. A method as claimed in claim 1, wherein each optical device has a NA value of up to 0.5.

7. A method as in claim 1, wherein each said optical device has a diameter in a range from 0.1 to 2 mm.

* * * * *